(12) United States Patent
Sarode Vishwanath et al.

(10) Patent No.: US 12,459,071 B2
(45) Date of Patent: Nov. 4, 2025

(54) COOLING BASE FOR A SUBSTRATE SUPPORT

(71) Applicant: Applied Materials, Inc., Santa Clara, CA (US)

(72) Inventors: Yogananda Sarode Vishwanath, Bangalore (IN); Anand Kumar, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 212 days.

(21) Appl. No.: 18/409,683

(22) Filed: Jan. 10, 2024

(65) Prior Publication Data
US 2025/0222550 A1    Jul. 10, 2025

(51) Int. Cl.
B23Q 11/10    (2006.01)
B23Q 3/15    (2006.01)

(52) U.S. Cl.
CPC .............. *B23Q 11/10* (2013.01); *B23Q 3/15* (2013.01)

(58) Field of Classification Search
CPC ...... B23Q 11/10; B23Q 3/15; H01L 21/67103; H01L 21/6831; H01L 21/67109
USPC ......................................................... 165/67
See application file for complete search history.

(56) References Cited

U.S. PATENT DOCUMENTS

| | | | |
|---|---|---|---|
| 9,659,803 B2 | 5/2017 | Lubomirsky et al. | |
| 2002/0132052 A1* | 9/2002 | Kumar | H01L 21/02 118/724 |
| 2014/0209596 A1* | 7/2014 | Lubomirsky | H01L 21/6831 219/465.1 |
| 2015/0129165 A1* | 5/2015 | Parkhe | H01L 21/67109 165/67 |
| 2015/0187625 A1* | 7/2015 | Busche | H01L 21/67109 361/234 |
| 2019/0249911 A1* | 8/2019 | Yamaguchi | H01L 21/67017 |
| 2022/0020599 A1* | 1/2022 | Koshizawa | H01L 21/02274 |
| 2025/0222550 A1* | 7/2025 | Sarode Vishwanath | H01L 21/67103 |
| 2025/0279313 A1* | 9/2025 | Vishwanath | H01J 37/32495 |

FOREIGN PATENT DOCUMENTS

KR    20190132307 A    11/2019

OTHER PUBLICATIONS

International Search Report and Written Opinion for Application No. PCT/US2024/061090 dated Apr. 4, 2025.

* cited by examiner

*Primary Examiner* — Steve S Tanenbaum
(74) *Attorney, Agent, or Firm* — Patterson + Sheridan, LLP (57) ABSTRACT

In one example, a substrate support assembly having a cooling base that promotes temperature uniformity. In one embodiment, the cooling base has a top plate. The top plate has cooling channels formed therein. The cooling base has a middle plate. The middle plate has a cooling return plenum disposed on a middle layer. A plurality of islands are disposed in the cooling return plenum. The middle plate has a cooling supply plenum disposed below the middle layer. A plurality of cooling inlets are disposed through the islands and couple the cooling supply plenum to the cooling channels. Cooling outlets fluidly couple the cooling channels to the cooling return plenum. The cooling base has a bottom plate. The bottom plate has a cooling inlets fluidly coupled to cooling supply plenum and cooling outlets fluidly coupled to the cooling return plenum.

20 Claims, 7 Drawing Sheets

COOLING BASE FOR A SUBSTRATE SUPPORT

BACKGROUND

Field

Implementations described herein generally relate to semiconductor manufacturing and more particularly to a substrate support assembly suitable for high temperature semiconductor manufacturing.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and the quality of individual substrates.

To drive down manufacturing cost, integrated chip (IC) manufactures demand higher throughput and better device yield and performance from every silicon substrate processed. Improving temperature uniformity of electrostatic chucks has been identified as one area that can improve device yield. Conventional electrostatic chucks are typically bonded to a cooling plate in the substrate support assembly. The conventional electrostatic chucks utilize a plurality of heaters along with the cooling plate to maintain temperature control along the surface of the silicon substrate during processing. However, conventional cooling bases do not always have rotational or azimuthal temperature symmetry. Currently cooling bases flow cooling liquid through plenums which cannot not always prevent higher temperatures in certain areas due to heat flux from chuck heaters and the plasma formed in the chamber. Additionally, local cold spots are often associated with portions of the cooling base through which lift pins, thermocouples, power lines and He supply lines are present. The non-uniformity of temperatures across the substrate support skews the processing results for the substrates undergoing processing thereon. Thus, correcting the non-uniformity of the substrate support temperature lowers throughput and decreases device yield and performance for the processing chambers.

Thus, there is a need for an improved substrate support assembly.

SUMMARY

In one example, a cooling base that promotes temperature uniformity is provided. In one embodiment, the cooling base has a top plate. The top plate has cooling channels formed therein. The cooling base has a middle plate disposed below the top plate. The middle plate has a cooling return plenum disposed on a middle layer. A plurality of islands are disposed in the cooling return plenum. The middle plate has a cooling supply plenum disposed below the middle layer. A plurality of cooling inlets are disposed through the islands and couple the cooling supply plenum to the cooling channels. Cooling outlets fluidly couple the cooling channels to the cooling return plenum. The cooling base has a bottom plate disposed below the middle plate. The bottom plate has a cooling inlets fluidly coupled to cooling supply plenum and cooling outlets fluidly coupled to the cooling return plenum.

In another example, a substrate support assembly having a cooling base that promotes temperature uniformity is provided. The substrate support assembly has a substrate support and a cooling base coupled to the substrate support. The cooling base has a top plate. The top plate has cooling channels formed therein. The cooling base has a middle plate disposed below the top plate. The middle plate has a cooling return plenum disposed on a middle layer. A plurality of islands are disposed in the cooling return plenum. The middle plate has a cooling supply plenum disposed below the middle layer. A plurality of cooling inlets are disposed through the islands and couple the cooling supply plenum to the cooling channels. Cooling outlets fluidly couple the cooling channels to the cooling return plenum. The cooling base has a bottom plate disposed below the middle plate. The bottom plate has a cooling inlets fluidly coupled to cooling supply plenum and cooling outlets fluidly coupled to the cooling return plenum.

In another example, a method for regulating the temperature of a substrate support disposed on a cooling base is provided. The method begins by flowing cooling fluid into a cooling fluid inlet plenum disposed in a middle plate of the cooling base. The cooling fluid is flowed into one of a plurality of cooling channels in a top plate of the cooling base from the cooling fluid inlet plenum. The cooling fluid from the cooling channel is then flowed through a cooling fluid outlet into a cooling fluid return plenum disposed in the middle plate, wherein the cooling fluid return plenum is vertically adjacent the cooling fluid supply plenum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Implementations described herein provide a substrate support assembly which enhances temperature uniformity during operation. The substrate support assembly has a substrate support bonded to a cooling base. The cooling base has a cooling area adjacent the substrate support. The cooling base is configured with a shortened cooling paths in a cooling area adjacent the substrate support. The cooling paths each have inlets and outlets for providing coolant flow to different zones, such as five different concentric zones, in a manner that ensures heat removal from each different zone is the same or different as the need may be. The cooling base plate is made of multiple layers to facilitate multiple cooling fluid entries from the inlet to a top surface of the cooling base. The cooling base outlet provides an immediate exit path for the cooling fluid from the top surface to shorten the cooling fluid path and time in a hot zone to enhance cooling over the entirely of the cooling area. The travel distance for the cooling fluid in the cooling area is small which keeps the cooling efficiency the same across the entire cooling area.

Figure 1:
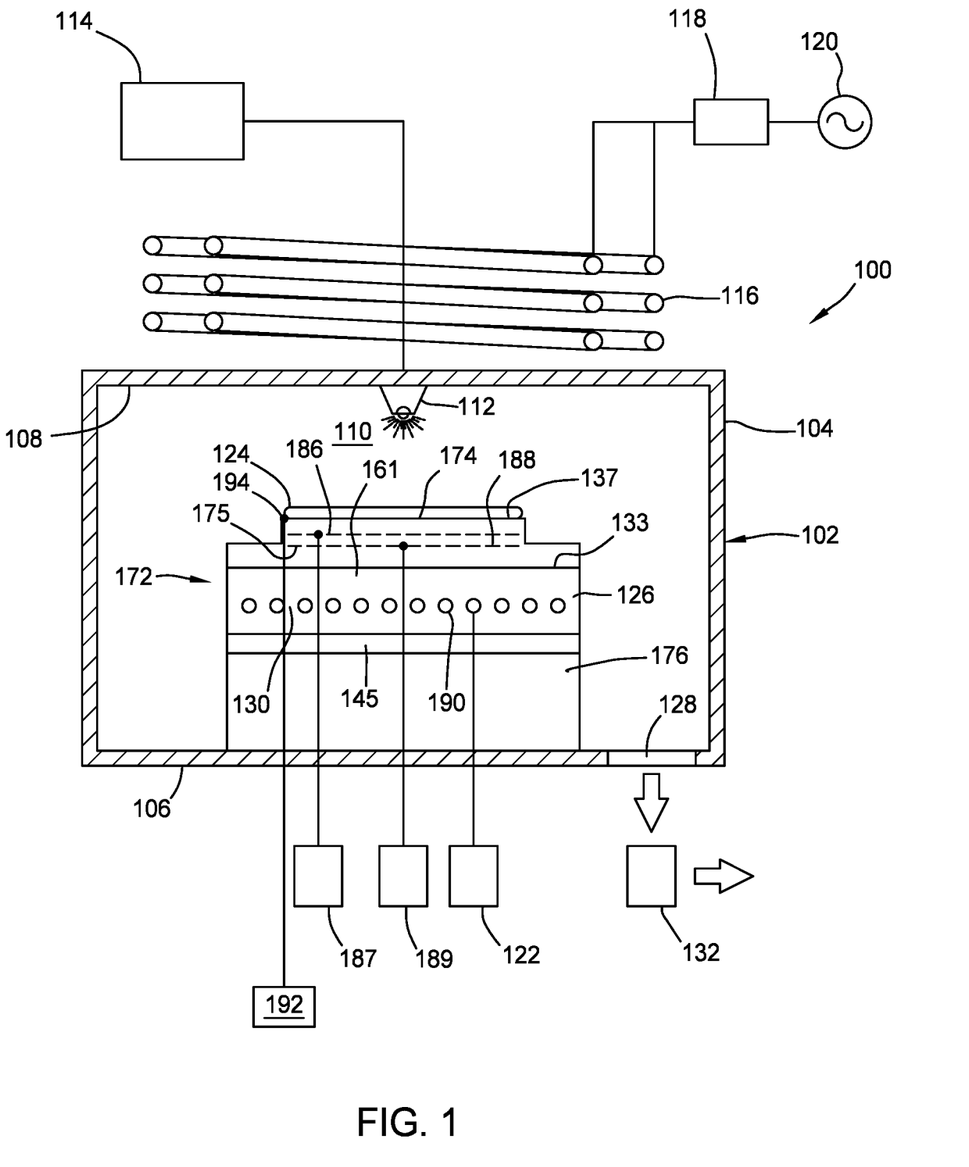
FIG. 1 is a cross-sectional schematic side view of a processing chamber having one embodiment of a substrate support assembly.

FIG. 1 is a cross-sectional schematic view of an exemplary plasma processing chamber 100, shown configured as an etch chamber, having a substrate support assembly 172. The substrate support assembly 172 may be utilized in other types of processing plasma chambers, for example plasma treatment chambers, annealing chambers, physical vapor deposition chambers, chemical vapor deposition chambers, and ion implantation chambers, among others, as well as other systems where the ability to control processing uniformity across a surface or workpiece, such as a substrate, is desirable.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Processing gas, along with any processing by-products, are removed from the processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the processing region 110.

The processing gas may be energized to form plasma within the processing region 110. The processing gas may be energized by capacitively or inductively coupling RF power to the processing gases. In the embodiment depicted in FIG. 1, a plurality of coils 116 are disposed above the lid 108 of the plasma processing chamber 100 and coupled through a matching circuit 118 to an RF power source 120 for inductively coupling the RF power to the processing gas.

The substrate support assembly 172 is disposed in the processing region 110 below the injection apparatus 112. The substrate support assembly 172 may include a substrate support 174, a cooling base 126, a facility plate 145, and a base plate 176 . . . . A conventional cooling base 130 could be used in the substrate support assembly 172 in place of cooling base 126 if diminished cooling is acceptable. The base plate 176 is supported by one of the sidewalls 104 or bottom 106 of the processing chamber. The substrate support assembly 172 may additionally include a heater assembly (not shown). Additionally, the substrate support assembly 172 may include an insulator plate (not shown) disposed between the conventional cooling base 130 and the base plate 176.

The substrate support 174 may be a heater, electrostatic chuck (ESC) or other suitable structure for supporting the substrate 124 during processing in the plasma processing chamber 100. The substrate support 174 has a dielectric body 175. The dielectric body 175 has a workpiece support surface 137 and a bottom surface 133 opposite the workpiece support surface 137. The substrate support 174 may also include lift pin holes for accommodating lift pins (not shown) for elevating the substrate 124 above the workpiece support surface 137 to facilitate robotic transfer into and out of the plasma processing chamber 100.

The workpiece support surface 137 may include gas passages 194. The gas passages 194 are coupled to a backside gas source 192. The backside gas source 192 provides an inert gas through the gas passages 194 to the interstitial space defined between the substrate 124 and the workpiece support surface 137 of the substrate support 174 for providing heat transfer and cooling the substrate 124. The gas passages 194 may be arranged in one or more zones. For example, the gas passages 194 may be arranged in three concentric independently controlled zones for better azimuthal temperature control of workpiece support surface 137. In another example, the substrate support 174 has gas passages 194 arranged in four concentric independently controllable zones.

The substrate support 174, when configured as an electrostatic chuck, may include a chucking electrode 186 embedded in the dielectric body 175. The chucking electrode 186 may be configured as a mono polar or bipolar electrode, or other suitable arrangement. The chucking electrode 186 is coupled through an RF filter to a chucking power source 187, which provides a RF or DC power to electrostatically secure the substrate 124 to the workpiece support surface 137 of the substrate support 174.

The dielectric body 175 may also include one or more resistive heaters 188 embedded therein. The resistive heaters 188 may be provided to elevate the temperature of the workpiece support surface 137 to a temperature suitable for processing a substrate 124 disposed thereon. The resistive heaters 188 are coupled through the facility plate 145 to a heater power source 189 for energizing and controlling the resistive heaters 188.

The cooling base 126 is supported by the base plate 176. The cooling base 126 may include cooling features 190 formed therein. The cooling features 190 may be connected to a heat transfer fluid source 122. The heat transfer fluid source 122 provides a heat transfer fluid, such as a liquid, gas or combination thereof, which is circulated through one or more cooling features 190 disposed in the cooling base 126. In one embodiment, the heat transfer fluid source 122 may provide about 4 gallons per minute of perfluorinated polyether cooling fluid at about 40 degrees Celsius. The fluid flowing through neighboring cooling features 190 may be isolated to enabling local control of the heat transfer between the substrate support 174 and different regions of the cooling base 126, which assists in controlling the lateral temperature profile of the substrate 124. In one embodiment, the heat transfer fluid circulating through the cooling features 190 of the cooling base 126 maintains the cooling base 126 at a temperature between about 90 degrees Celsius and about 80 degrees Celsius or at a temperature lower than 90 degrees Celsius.

The substrate support 174 may be disposed on cooling base 126. The cooling base 126 may be bonded to the substrate support 174 by an adhesive layer. The adhesive layer may have a thermal conductivity between about 0.1 W/mK and about 1 W/mK, such as about 0.17 W/mK. A plurality of fluid passages may be formed in the upper surface of the cooling base 126 for regulating the temperature between the substrate support 174 and the cooling base 126. The lower surface of the cooling base 126 may be disposed on the facility plate 145, heater, or base plate 176.

Figure 2:
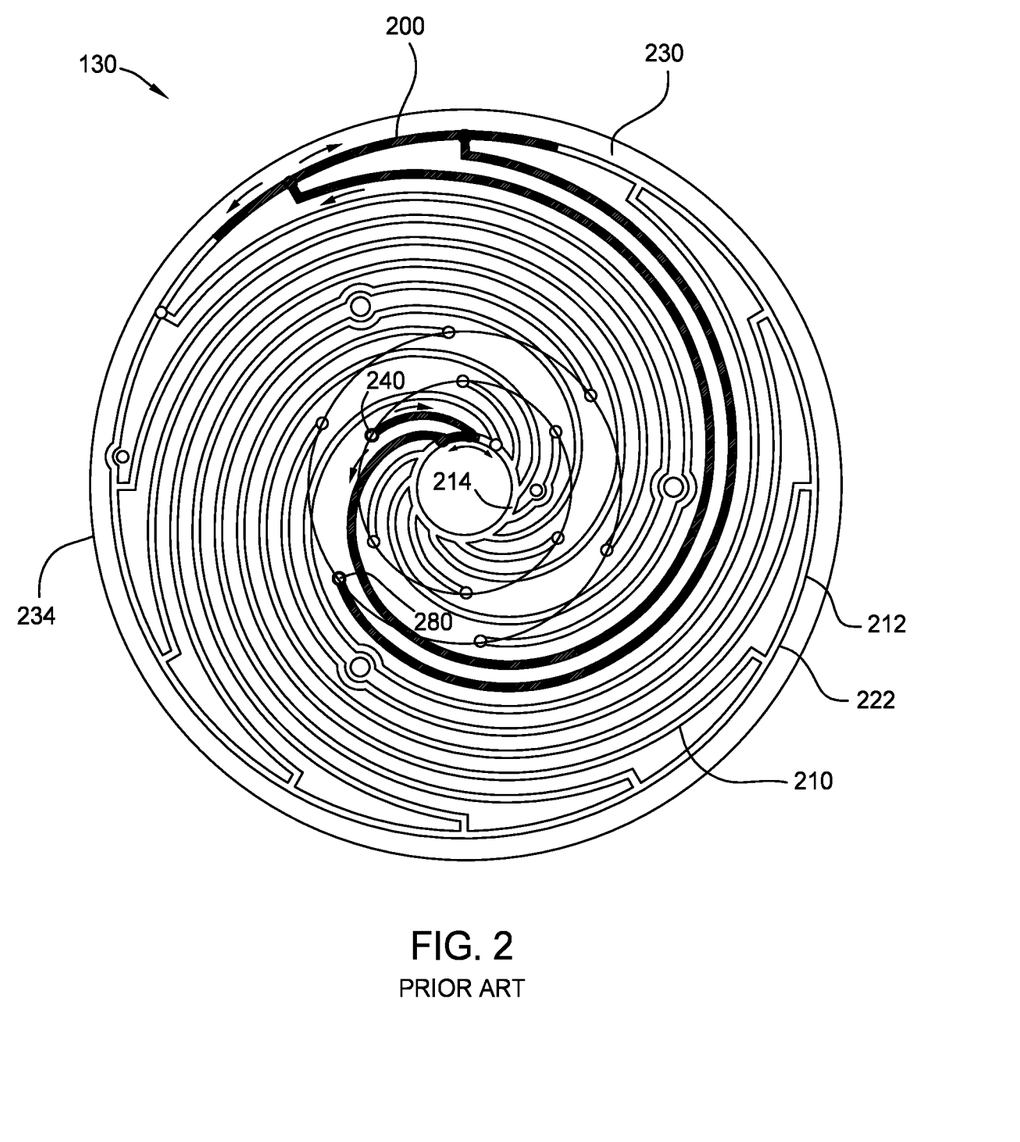
FIG. 2 is a top plan view of a conventional cooling base for the substrate support assembly.

FIG. 2 is a top plan view of a conventional cooling base 130 having a cap removed to expose one of the plurality of cooling channels 210 disposed therein. The conventional cooling base 130 could be used in the processing chamber 100 in place of cooling base 126 if diminished cooling is acceptable. The conventional cooling base 130 has a top surface, a bottom surface and an outer periphery 234. The top surface is disposed below the substrate support 174. The bottom surface is disposed above the facility plate 145 of the substrate support assembly 172. The conventional cooling base 130 has a plurality of cooling features, such as a plurality of cooling channels 210.

The plurality of cooling channels 210 may be formed in the body 230. The cooling channels 210 are configured to transport a cooling fluid therethrough. The cooling fluid regulates the temperature of the conventional cooling base 130. The cooling channels 210 have a polar array of spirals and extend between an inner ring-shaped channel 214 and an outer ring-shaped channel 212.

The conventional cooling base 130 has equally spaced cooling channels 210. The cooling channels 210 may have a spiral shape for flowing a cooling liquid therethrough. The cooling channels 210 possess rotational symmetry with each other cooling channel 210 and have a constant pitch. The number of cooling channels 210 are typically made in multiples of 3 to simplify accommodating 3 lift pins between the cooling channels 210. Each cooling channel 210 is terminated by an inlet and an outlet hole, and splits into several parts Fluid flows through the first cooling channel 200 to regulate the temperature of the conventional cooling base 130. The features disclosed with respect to the discussion of the first cooling channel 200 may also be found on each of the other cooling channels 222. Thus, each cooling channel 210 is substantially similar to the first cooling channel 200 unless otherwise indicated.

The first cooling channel 200 may have an inlet 240 and an outlet 280. The inlet 240 is configured to provide a cooling fluid into the first cooling channel 200. The inlet 240 may be fluidly connected to an external cooling fluid source such as the heat transfer fluid source 122 depicted in FIG. 1. The cooling fluid through the first cooling channel 200 from the inlet 240 to the outlet 280. A temperature of the fluid may increase from the inlet 240 to the out 280 as heat is transferred to the cooling fluid from the conventional cooling base 130. The outlet 280 receives the cooling fluid from the first cooling channel 200. The heat transfer fluid flows through the first cooling channel 200 to regulate the temperature of the conventional cooling base 130. The heat transfer fluid exits the first cooling channel 200 at the outlet 280.

The first cooling channel 200 has a generally spiral geometry winding around the inner ring-shaped channel 214 at the center of the conventional cooling base 130 with individual segments getting progressively further or closer away from the inner ring-shaped channel 214 as the first cooling channel 200 revolves around the inner ring-shaped channel 214. In the conventional cooling base 130, the cooling fluid entering from the inlet 240 travels a long distance along each cooling channel 210 before it exits from the outlet 280 which leads to temperature uniformity issues as the cooling fluid temperature increases from the inlet 240 to the outlet 280. Compared to the conventional cooling base 130, the cooling base 126 has a shorter path along each cooling channel.

Figure 3A:
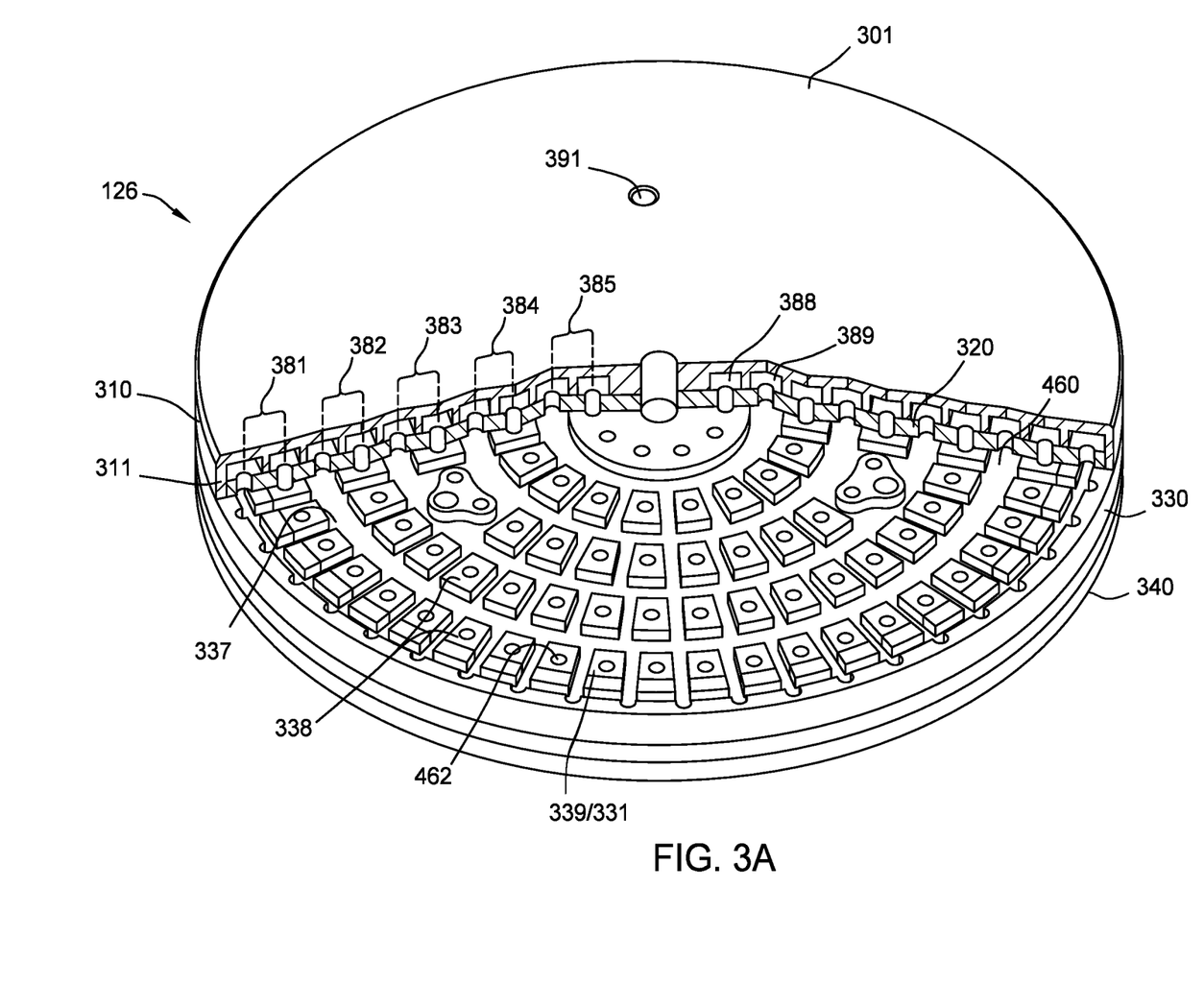
FIGS. 3A-3B are isometric cross-sectional views of an improved cooling base suitable for use in the processing chamber 100 in FIG. 1.
Figure 3B:
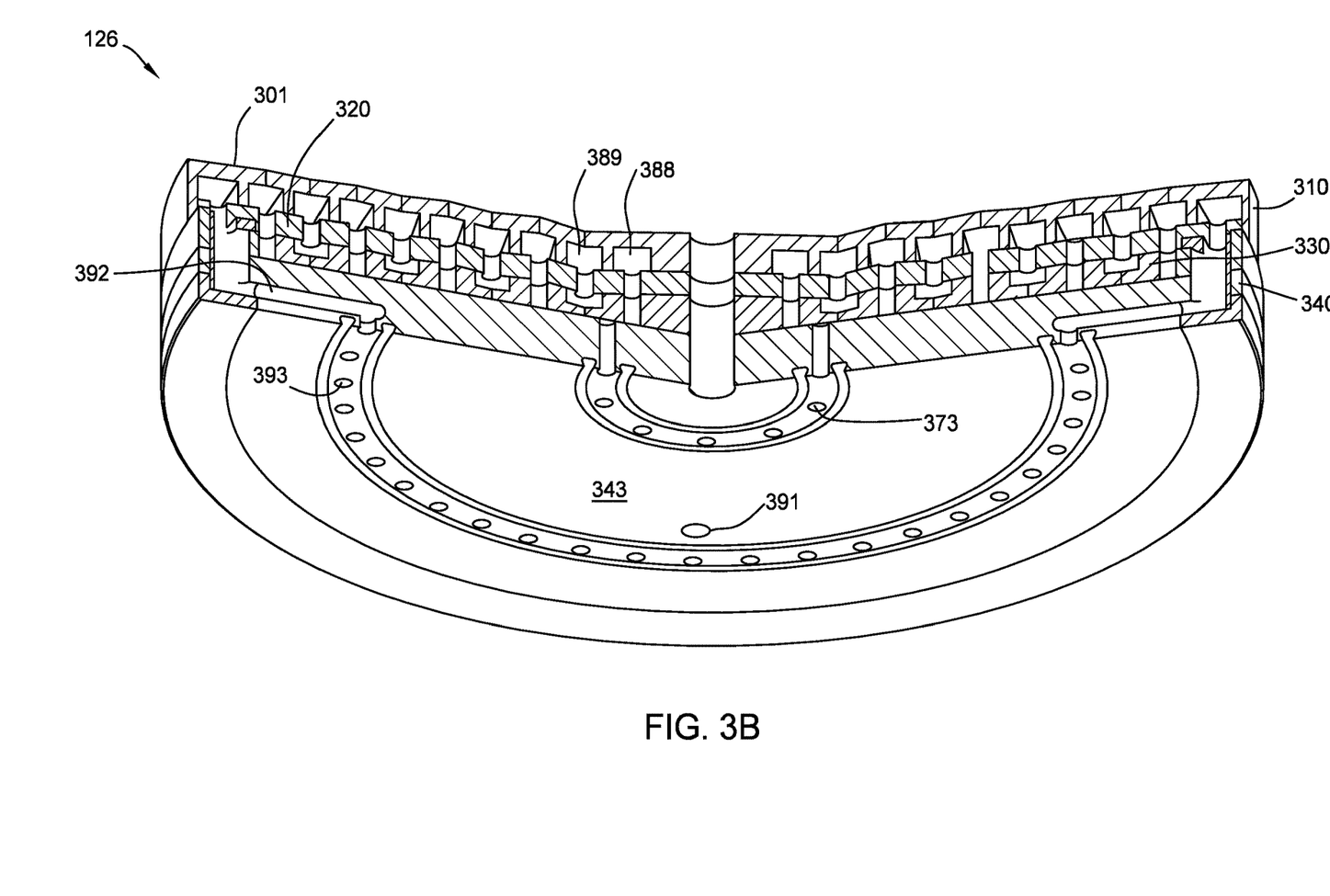

FIGS. 3A-3B are isometric cross-sectional views of the improved cooling base 126 suitable. As discussed above, the cooling base 126 has shortened cooling paths in the hot area of the cooling base 126 adjacent the substrate support 174 enabled by a plenum design for discretely distributing cooling fluid. The shorter cooling path in the hot area reduces the temperature change of the cooling fluid along the cooling path to better maintain the temperature uniformity of the substrate support 174. The cooling base 126 relies on a plenum type configuration that offers improved thermal uniformity. In this configuration the cooling base 126 is made of multiple plates to facilitate the multiple cooling fluid entries along a top surface and the immediate exit path of the cooling fluid from the top surface to shorten the cooling fluid time in a hot zone, i.e., the top surface, adjacent the substrate support 174. The travel distance for the fluid in the hot zone is minimized to maintain the cooling efficiency throughout the cooling area. This ensures the heat removal in different areas of the hot zone is substantially the same, which provides improved thermal uniformity on the substrate support 174 that is disposed on the cooling base 126.

The cooling base 126 has a top plate 310 and a bottom plate 340. The top plate 310 is configured to be disposed adjacent to the substrate support 174. The cooling base 126 has one or more middle plates. A first middle plate 320 is disposed adjacent and below the top plate 310. A second middle plate 330 is disposed between the first middle plate 320 and the bottom plate 340. It is contemplated that the bottom plate 340 and the second middle plate 330 may be formed from one or more layers.

Figure 4:
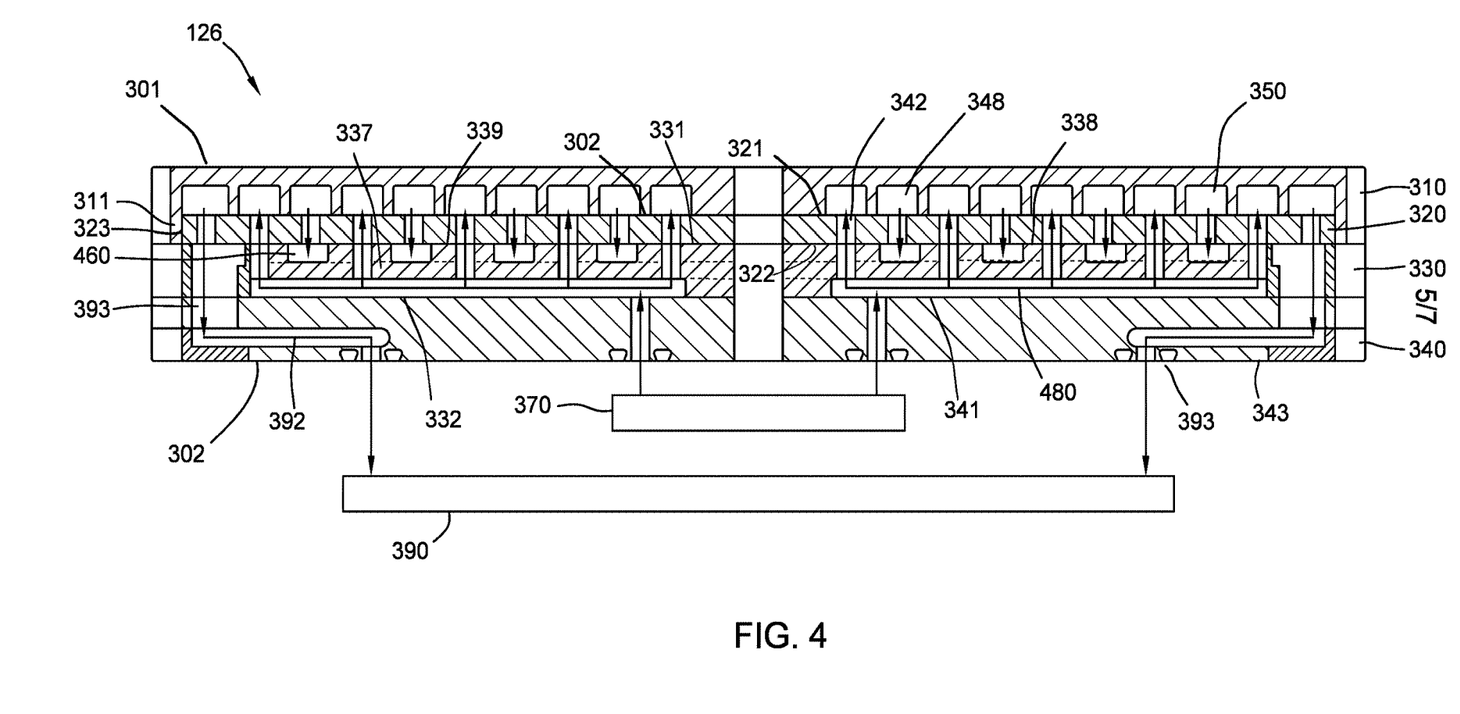
FIG. 4 is a side plan view of the cooling base exposing all the cooling channels.
Figure 5:
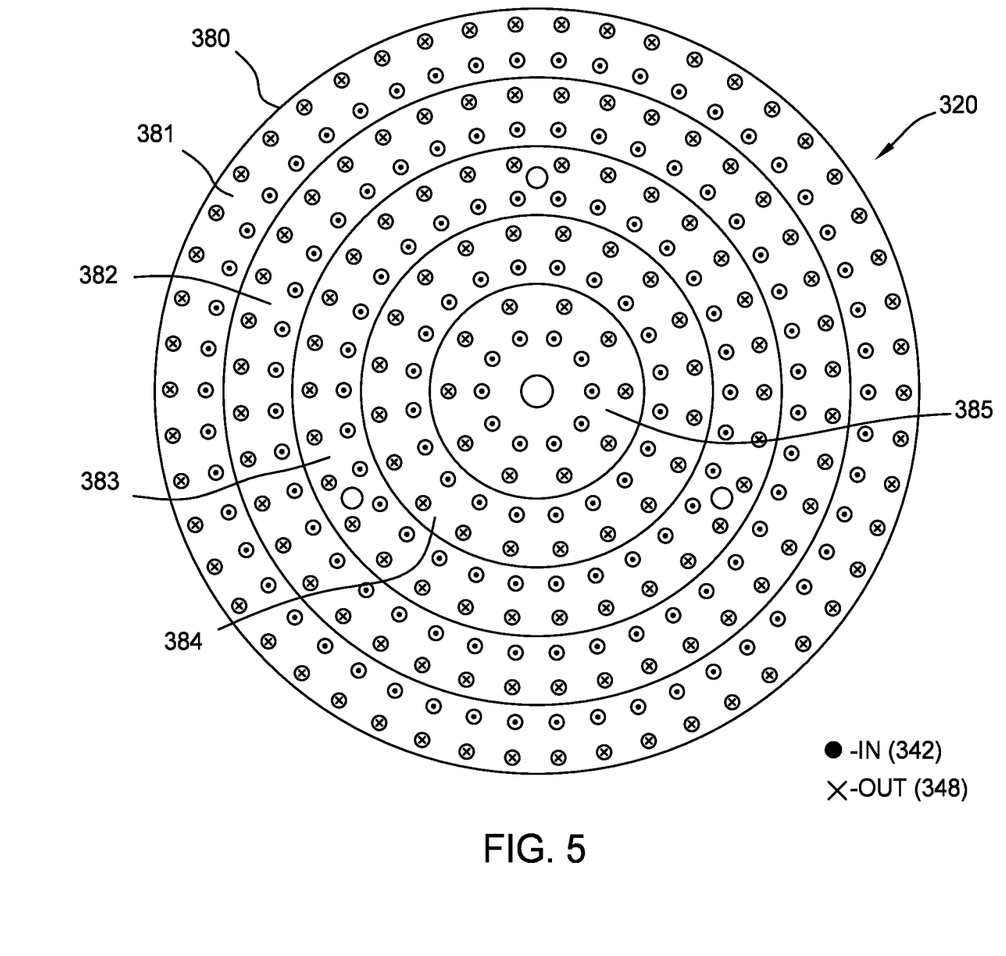
FIG. 5 is a top plan view of a middle plate in the cooling base exposing all the cooling inlet holes and outlet holes.

In the discussion below, the cooling base 126 will be discussed additionally with respect to FIGS. 4 and 5. FIG. 4 is a side plan view of the cooling base 126. FIG. 5 is a top plan view of a middle plate in the cooling base exposing all the cooling inlet holes and outlet holes.

The top plate 310 has a top surface 301 and a bottom surface 302. The top surface 301 is opposite the bottom surface 302. Lift pin holes 391 are disposed through the top surface 301 and extend through the bottom surface 302. As shown in FIG. 4, the top plate 310 may optionally have an outer flange 311. The outer flange 311 may extend below the bottom surface 302. Alternately, the top plate 310 does not have the outer flange 311 extending below the bottom surface 302. That is, where the bottom surface 302 of the top plate 310 is the lower most surface of the top plate 310.

The top plate 310 has cooling channels 350 open to a bottom surface 302 of the top plate 310. The outer flange 311, one present, extends beyond and below the bottom surface 302. The cooling channels 350 are configured to prevent cooling fluid from flowing from center to edge of the top plate 310. The cooling channels 350 are configured to maintain cooling fluid in the top plate for a minimal duration and length. Thus, cooling fluid entering the cooling channel 350 immediately exit from the same cooling channel to maintain cooling efficiency throughout the top plate 310.

The cooling channels 350 may be pared into concentric rings or zones 380. For example, a fifth cooling channel zone 385 may have a first channel 388 and a second channel 389. The fifth cooling channel zone 385 is provided with coolant through the first channel 388 and the coolant exists the fifth cooling channel zone 385 through the second channel 389. The first channel 388 and the second channel 389 are immediately adjacent to each other to minimize coolant exposure heat from the top plate 310. In one example, the second channel 389 is immediately disposed outward of the first channel 388. In another example, the first channel 388 is immediately disposed outward of the second channel 389. Alternately, second channel 389 and the first channel 388 may be radially adjacent. A fourth cooling channel zone 384 is fluidly isolated from the fifth cooling channel zone 385. Likewise a first cooling channel 381, a second cooling channel zone 382, and third cooling channel zone 383 are fluidly isolated from each other and both the fifth cooling channel zone 385 and the fourth cooling channel zone 384. Although five cooling channels zones are depicted, the top plate 310 may have any number of zones including three concentric zones. Additionally, it should be appreciated that the cooling channel zones may be further broken down into a plurality of subzones. For example, the fifth cooling channel may have 10 subzones.

The first middle plate 320 has an upper surface 321 and a lower surface 322 opposite the upper surface 321. The upper surface 321 is configured to contact the bottom surface 302 of the top plate 310. The first middle plate 320 has an outer edge 323. In one example, the outer edge 323 is adjacent to the outer flange 311 of the top plate 310. The outer flange 311 of the top plate 310 extends down to and has a bottom coplanar with the lower surface 322 of the first middle plate 320. In another example, the outer edge 323 of the first middle plate 320 extends to the outer periphery of the cooling base 126.

As additionally seen in FIG. 5, the upper first middle plate 320 has a plurality of fluid inlets 342 and fluid outlets 348. The fluid inlet 342 is configured to provide cooling fluid into the cooling channels 350 of the top plate 310. The fluid outlet 348 is configured to drain cooling fluid from the cooling channels 350. It is contemplated that each fluid inlet 342 may have a one to one relationship with a respective fluid outlet 348. In this manner the flow of cooling fluid into the cooling channels 350 is not impeded by either the fluid inlet 342 or the fluid outlet 348. In one example, a fifth channel of the cooling channels 350 disposed in the fifth channel zone 385 has three or more fluid inlets 342 and fluid outlets 348. That is, a single cooling channel of the cooling channels 350 may have more than one fluid inlets 342 and an equal number greater than one fluid outlets 348. The fluid inlet 342 and the fluid outlets 348 for a respective cooling zone are be balanced to accommodate the same flow. Alternately, the cooling zones may have subzones each containing a single cooling channel 350 have a singular fluid inlet 342 coupling to a respective fluid outlet 348. In this manner, cooling fluid flowing entering the cooling channel 350 may better maintain constant the temperature across the top surface 301 of the top plate 310.

The second middle plate 330 has a top surface 331 and a bottom surface 332. The second middle plate 330 has a middle layer 337 disposed between the bottom surface 332 and the top surface 331. The second middle plate 330 has a plurality of islands 338 extending up from the middle layer 337. The islands 338 have a top 339. The top 339 of the islands are coincident with the top surface 331 of the second middle plate 330. Each island of the plurality of islands 338 has a respective inlet port 462 disposed through the island from the top surface 331. The inlet port 462 is configured to align with the fluid inlet 342 of the first middle plate 320. That is, the inlet port 462 is fluidly coupled to the fluid inlet 342. In this manner, cooling fluid only moves through the inlet port 462 of the second middle plate 330 and the fluid inlet 342 of the first middle plate 320 in supplying cooling fluid to the top plate 310.

The islands 338 form a return plenum 460 in the second middle plate 330. The return plenum 460 is formed between the middle layer 337 of the second middle plate 330, the sides of the islands 338, and the lower surface 322 of the first middle plate 320. The return plenum 460 is fluidly coupled to the fluid outlets 348. The return plenum 460 collects the spent cooling fluid returning through the fluid outlets in the first middle plate 320 from the cooling channels 350 in the top plate 310.

A supply plenum 480 is disposed below the return plenum 460 in the second middle plate 330. The supply plenum 480 formed between the middle layer 337 and a top surface 341 of the bottom plate 340. The supply plenum 480 is fluidly coupled to the inlet ports 462 disposed in the plurality of islands 338. The supply plenum 480 is configured to supply cooling fluid through the inlet ports 462 and the fluid inlets 342 into the cooling channels 350 for regulating the temperature of the top plate 310. The middle layer 337 may be formed with a thermally insulating material to mitigate heat transfer between the supply plenum 480 and the return plenum 460. Alternately, the supply plenum 480 and the return plenum 460 may be reversed. For example, the supply plenum may be located at item 460 and the return plenum may be located at item 480.

The supply plenum 480 allows constant temperature cooling fluid to be provided throughout top plate 310. The return plenum 460 ensure the spent cooling fluid is quickly removed away for increased thermal uniformity of the top plate 310. The second middle plate 330 coupled with the first middle plate 320 provide the cooling fluid with a minimal time in the top plate 310.

The bottom plate 340 has a bottom surface 343 opposite the top surface 341. The top surface 341 supports the second middle plate 330 of the cooling base 126. The bottom surface 343 is the bottom surface 302 of the cooling base 126. A coolant supply channel 373 is provided through the bottom plate 340. The coolant supply channel 373 fluidly couples the supply plenum 480 to a coolant supply source 370, such as heat transfer fluid source 122. In one example, as shown in FIG. 3B, the bottom plate 340 has a plurality of coolant supply channel 373 disposed radially about a center of the bottom plate 340.

A coolant return channel 393 is provided through the bottom plate 340. The coolant return channel 393 fluidly couples to the return plenum 460 through a return passage 392 disposed with the bottom plate 340. The coolant return channel 393 couples the return passage 392 to a coolant heat exchanger 390, or back to the coolant supply source 370, outside the bottom plate 340. In one example, as shown in FIG. 3B, the bottom plate 340 has a plurality of coolant return channels 393 disposed radially about a center of the bottom plate 340. In one example, the coolant return channels 393 are disposed outward from the coolant supply channels 373. Or in other words, the coolant return channels 393 circumscribe the coolant supply channels 373.

The described coolant structure for the cooling base 127 enhances temperature uniformity of the substrate support assembly 172 during operation. The cooling base 127 has a cooling area in the top plate 310 adjacent the substrate support 174. The cooling base is configured with cooling channels 350 having one or more fluid inlets 342 and fluid outlets 348. The fluid inlets 342 and fluid outlets 348 provide coolant flow to different fluidly isolated zones for the cooling channels 350. The cooling base 127 provides an immediate exit path in the fluid outlets 348 for the cooling fluid to shorten the cooling fluid path and time in a hot zone of the cooling base 127 adjacent the substrate support 174.

The shortened cooling fluid path provides enhanced cooling capacity over the entirely of the cooling area in the hot zone. The travel distance for the cooling fluid in the cooling channels 350 is small which keeps the cooling efficiency the same across the entire top surface 301 of the top plate 310.

Figure 6:
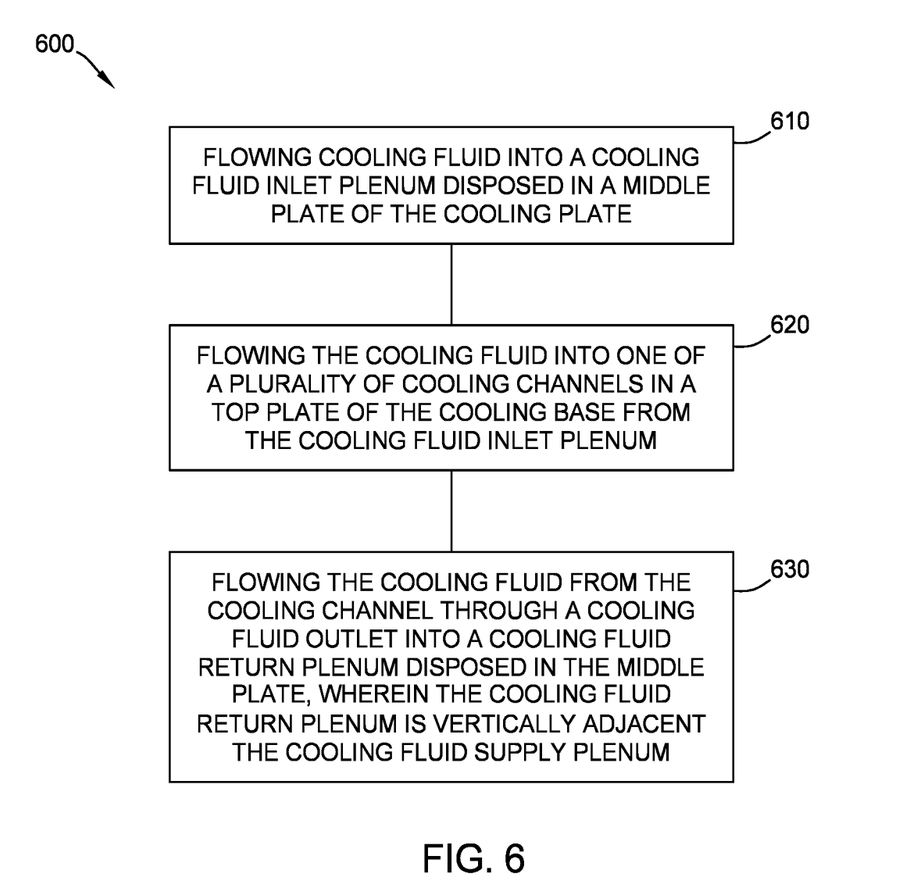
FIG. 6 describes a method for cooling a substrate support with the cooling base of FIGS. 3A-3B.

FIG. 6 describes a method 600 for cooling a substrate support with the cooling base of FIGS. 3A and 3B. The method 600 begins at operation 610 wherein cooling fluid is flowed into a cooling fluid inlet plenum disposed in a middle plate of the cooling base. At operation 620, the cooling fluid is flowed into one of a plurality of cooling channels in the top plate of the cooling base from the cooling fluid inlet plenum. The cooling channel has a cooling fluid inlet and a cooling fluid outlet. In one example, the cooling fluid channel has a three or more cooling fluid inlets and respective cooling fluid outlets. At operation 630, cooling fluid from the cooling channel is flowed through the cooling fluid outlet into a cooling fluid return plenum. The cooling fluid return plenum is disposed in the cooling base vertically adjacent to the cooling fluid supply plenum. The cooling fluid return plenum has a plurality of islands through which the cooling fluid is supplied to the cooling channel.

Advantageously, the shortened cooling channels in the top plate coupled to the supply and return plenum below the top plate enable enhanced temperature control and uniformity along the top surface of the cooling plate.

While the foregoing is directed to specific embodiments, other and further embodiments may be devised without departing from the basic scope thereof, and the scope thereof is determined by the claims that follow.

What is claimed is:

1. A cooling base comprising:
   a top plate having cooling channels formed therein;
   a middle plate disposed below the top plate, the middle plate comprising:
      a cooling return plenum disposed on a middle layer;
      a cooling supply plenum disposed below the middle layer;
      a plurality of islands disposed on the middle layer in the cooling return plenum;
      a plurality of cooling inlets disposed through the plurality of islands and coupling the cooling supply plenum to the cooling channels; and
      a plurality of cooling outlets fluidly coupling the cooling channels to the cooling return plenum; and
   a bottom plate disposed below the middle plate, the bottom plate having cooling inlets fluidly coupled to the cooling supply plenum and cooling outlets fluidly coupled to the cooling return plenum.

2. The cooling base of claim 1, further comprising:
   a first insert disposed in one or more of the cooling inlets of the plurality of cooling inlets wherein the first insert determines fluid flow through the cooling inlet.

3. The cooling base of claim 1, further comprising:
   a second insert disposed in one or more of the cooling outlets of the plurality of cooling outlets wherein the second insert determines fluid flow through the cooling inlet.

4. The cooling base of claim 1, wherein the top plate further comprises:
   a plurality of zones in which the cooling channels are arranged, wherein each zone is fluidly isolated from all other zones and is fluidly coupled to 2 or more cooling inlets of the plurality of cooling inlets.

5. The cooling base of claim 4, wherein first fluid inlets disposed in a first zone of the plurality of zones has a first opening size through which fluid flows which is different than second fluid inlets disposed in a second zone of the plurality of zones.

6. The cooling base of claim 4, wherein cooling fluid flow through a first zone of the plurality of zones is different than cooling fluid flow through a second zone of the plurality of zones.

7. The cooling base of claim 4, wherein each zone is fluidly coupled to 2 or more cooling outlets of the plurality of cooling outlets.

8. The cooling base of claim 7, wherein the plurality of zones are concentric to one another.

9. The cooling base of claim 7, wherein a first number of the cooling outlets in a first zone is less than a second number of the cooling outlets in a second zone.

10. A substrate support assembly comprising:
    a substrate support;
    a cooling base coupled to the substrate support, the cooling base comprising:
       a top plate having cooling channels formed therein;
       a middle plate disposed below the top plate, the middle plate comprising:
          a cooling return plenum disposed on a middle layer;
          a cooling supply plenum disposed below the middle layer;
          a plurality of islands disposed on the middle layer in the cooling return plenum;
          a plurality of cooling inlets disposed through the plurality of islands and coupling the cooling supply plenum to the cooling channels; and
          a plurality of cooling outlets fluidly coupling the cooling channels to the cooling return plenum; and
       a bottom plate disposed below the middle plate, the bottom plate having cooling inlets fluidly coupled to the cooling supply plenum and cooling outlets fluidly coupled to the cooling return plenum.

11. The substrate support assembly of claim 10, further comprising:
    a first insert disposed in one or more of the cooling inlets of the plurality of cooling inlets wherein the first insert determines fluid flow through the cooling inlet.

12. The substrate support assembly of claim 10, further comprising:
    a second insert disposed in one or more of the cooling outlets of the plurality of cooling outlets wherein the second insert determines fluid flow through the cooling inlet.

13. The substrate support assembly of claim 10, wherein the top plate further comprises:
    a plurality of zones in which the cooling channels are arranged, wherein each zone is fluidly isolated from all other zones and is fluidly coupled to 2 or more cooling inlets of the plurality of cooling inlets.

14. The substrate support assembly of claim 13, wherein first fluid inlets disposed in a first zone of the plurality of zones has a first opening size through which fluid flows which is different than second fluid inlets disposed in a second zone of the plurality of zones.

15. The cooling base of claim 13, wherein cooling fluid flow through a first zone of the plurality of zones is different than cooling fluid flow through a second zone of the plurality of zones.

16. The substrate support assembly of claim 13, wherein each zone is fluidly coupled to 2 or more cooling outlets of the plurality of cooling outlets.

17. The substrate support assembly of claim 16, wherein the plurality of zones are concentric to one another.

18. The substrate support assembly of claim 17, wherein a first number of the cooling outlets in a first zone is less than a second number of the cooling outlets in a second zone.

19. A method for regulating a temperature of a substrate support disposed on a cooling base, the method comprising:
flowing cooling fluid into a cooling fluid supply plenum disposed in a middle plate of the cooling base;
flowing the cooling fluid into one of a plurality of cooling channels in a top plate of the cooling base from the cooling fluid supply plenum; and
flowing the cooling fluid from the cooling channel through a cooling fluid outlet into a cooling fluid return plenum disposed in the middle plate, wherein the cooling fluid return plenum is vertically adjacent a cooling fluid supply plenum.

20. The method of claim 19 wherein the cooling channels have three or more cooling fluid inlets and respective cooling fluid outlets and the cooling fluid return plenum is disposed in the cooling base vertically adjacent to the cooling fluid supply plenum.

\* \* \* \* \*